(12) United States Patent
Li et al.

(10) Patent No.: US 9,780,150 B2
(45) Date of Patent: Oct. 3, 2017

(54) ORGANIC LIGHT EMITTING DIODE DISPLAY DEVICE AND MANUFACTURING METHOD THEREOF

(71) Applicants: Shanghai Tianma AM-OLED Co., Ltd., Shanghai (CN); Tianma Micro-Electronics Co., Ltd., Shenzhen (CN)

(72) Inventors: Song Li, Shanghai (CN); Sheng Huang, Shanghai (CN); Ning Yu, Shanghai (CN); Liyuan Luo, Shanghai (CN); Bojia Lv, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 41 days.

(21) Appl. No.: 14/752,357

(22) Filed: Jun. 26, 2015

(65) Prior Publication Data
US 2016/0240592 A1  Aug. 18, 2016

(30) Foreign Application Priority Data
Feb. 16, 2015 (CN) .......................... 2015 1 0084603

(51) Int. Cl.
*H01L 27/32* (2006.01)
*H01L 51/56* (2006.01)

(52) U.S. Cl.
CPC ...... *H01L 27/3216* (2013.01); *H01L 27/3218* (2013.01); *H01L 27/3246* (2013.01)

(58) Field of Classification Search
None
See application file for complete search history.

(56) References Cited

U.S. PATENT DOCUMENTS

| | | | |
|---|---|---|---|
| 2011/0291550 A1* | 12/2011 | Kim | G09G 3/2003 313/504 |
| 2013/0057521 A1 | 3/2013 | Kim | |
| 2014/0252321 A1* | 9/2014 | Pyon | H01L 27/3216 257/40 |
| 2015/0001501 A1* | 1/2015 | Cho | H01L 51/5253 257/40 |

FOREIGN PATENT DOCUMENTS

| | | | |
|---|---|---|---|
| CN | 101393924 A | | 3/2009 |
| CN | 102224591 A | | 10/2011 |
| CN | 102262854 A | | 11/2011 |
| CN | 104241314 A | | 12/2014 |
| KR | 10-2011-0129531 | * | 12/2011 |

* cited by examiner

*Primary Examiner* — Ashok Patel
(74) *Attorney, Agent, or Firm* — Faegre Baker Daniels LLP

(57) ABSTRACT

An Organic Light Emitting Diode (OLED) display device and a manufacturing method thereof, the OLED display device including: a substrate; a pixel definition layer located on the substrate, wherein a plurality of pixel units arranged together are defined in the pixel definition layer, at least one of the pixel units comprises at least one first sub pixel, at least one second sub pixel and at least one third sub pixel, and the third sub pixel comprises at least two third secondary sub pixels; a first organic light emitting layer arranged in each of the at least one first sub pixel, a second organic light emitting layer arranged in each of the at least one second sub pixel, and third organic light emitting layers arranged in the at least two third secondary sub pixels of the at least one third sub pixel.

8 Claims, 8 Drawing Sheets

ORGANIC LIGHT EMITTING DIODE DISPLAY DEVICE AND MANUFACTURING METHOD THEREOF

CROSS-REFERENCE TO RELATED APPLICATION

This application claims priority to Chinese Application No. 201510084603.9, filed Feb. 16, 2015, which is herein incorporated by reference in its entirety.

TECHNICAL FIELD

The present disclosure relates to the field of display technologies, in particular to an Organic Light Emitting Diode (OLED) display device and a manufacturing method thereof.

BACKGROUND

An OLED is a semiconductor device which can convert electrical energy into light energy, and is widely used in the next generation of display panels due to its advantages such as lightness, thinness, high contrast ratio, quick response and wide visual angle. Depending on its driving manner, the OLED can be an Active-Matrix Organic Light Emitting Diode (AMOLED) or a Passive-Matrix Organic Light Emitting Diode (PMOLED).

An AMOLED display device includes a plurality of pixel units arranged in a matrix, and each of the plurality of pixel units includes a red sub pixel R, a blue sub pixel B and a green sub pixel G. The red sub pixel R, the blue sub pixel B and the green sub pixel G are made of different organic light emitting materials and hence have different light emitting properties. In particular, the green sub pixel G has the strongest luminance among the red, green and blue sub pixels R, G and B, and hence imposes the most intensive stimulation to user's eyes, which directly influences the judgment made by the user's eyes on a spatial position of an image displayed in the display panel of the display device, thus resulting in a phenomenon of non-uniformity of a gravity center of a displayed image.

FIG. 1a is a structural view showing pixel units in an organic light emitting diode display device in the related art. Referring to FIG. 1a, given that areas of the red sub pixel R, the blue sub pixel B and the green sub pixel G in each pixel unit are the same to each other and the green sub pixel G has higher luminance than the red sub pixel R and the blue sub pixel B, the non-uniformity of the gravity center of a displayed image is caused when an image is displayed by the AMOLED display panel. To alleviate the non-uniformity of the gravity center of a displayed image, two green sub pixels G are provided in one pixel unit in the related art (referring to FIG. 1B). However, during manufacturing the AMOLED display panel, an alignment system with high accuracy and a Fine Metal Mask (FMM) are required to perform vapor deposition on the red sub pixel R, the blue sub pixel B and the green sub pixel G, respectively, and an offset likely happens during the vapor deposition because of the limited accuracy of the FMM, so that the organic light emitting materials are overlapped with one another to cause color mixing in the AMOLED display panel, thus decreasing the yield of the AMOLED display panel.

SUMMARY

The object of the present disclosure provides an organic light emitting diode display device and a manufacturing method thereof such that the gravity center of the displayed image in the organic light emitting diode display device can be balanced and the color mixing in the organic light emitting diode display panel can be avoided, thereby increasing the yield of the organic light emitting diode display device.

In a first example of the disclosure, embodiments of the disclosure provide an organic light emitting diode display device, including:

a substrate;
where a plurality of pixel units arranged together are defined in the pixel definition layer, the pixel unit includes at least one first sub pixel, at least one second sub pixel and at least one third sub pixel, and the third sub pixel includes at least two third secondary sub pixels;
a first organic light emitting layer arranged in each of the at least one first sub pixel, where the first organic light emitting layer includes a first organic light emitting material for emitting light in a first primary color;
a second organic light emitting layer arranged in each of the at least one second sub pixel, where the second organic light emitting layer includes a second organic light emitting material for emitting light in a second primary color; and
third organic light emitting layers arranged in the at least two third secondary sub pixels of the at least one third sub pixel, where the third organic light emitting layers include a third organic light emitting material for emitting light in a third primary color that has the strongest luminous characteristic;
where the third organic light emitting layers arranged in the at least two third secondary sub pixels are connected with each other.

In a second example of the disclosure, embodiments of the disclosure provide a manufacturing method of an organic light emitting diode display device, including:

forming a region limitation layer on a substrate; patterning the region limitation layer by using a first mask to form a pixel definition layer, where a plurality of pixel units arranged together are defined in the pixel definition layer, wherein the pixel unit includes at least one first sub pixel, at least one second sub pixel and at least one third sub pixel, and each of the third sub pixels includes at least two third secondary sub pixels;
forming a first organic light emitting layer in the at least one first sub pixel by means of vapor deposition by using a second mask, wherein the first organic light emitting layer includes a first organic light emitting material for emitting light in a first primacy color;
forming a second organic light emitting layer in the at least one second sub pixel by means of vapor deposition by using a third mask, where the second organic light emitting layer includes a second organic light emitting material for emitting light in a second primacy color; and
forming third organic light emitting layers in the at least two third secondary sub pixels of the at least one third sub pixel by means of vapor deposition by using a fourth mask, where the third organic light emitting layers include a third organic light emitting material for emitting light in a third primary color that has the strongest luminous characteristic, and where the third organic light emitting layers arranged in the at least two third secondary sub pixels are formed in a same process step;

at least two openings of the first mask which are used to form the at least two third secondary sub pixels in the at least one third sub pixel correspond to an opening of the fourth mask which is used to form the third organic light emitting layers.

In the organic light emitting diode display device and the manufacturing method thereof, a plurality of pixel units arranged together are defined in a pixel definition layer, the pixel unit includes at least one first sub pixel, at least one second sub pixel and at least one third sub pixel, where a first organic light emitting layer is arranged in each of the at least one first sub pixel, a second organic light emitting layer is arranged in each of the at least one second sub pixel, and third organic light emitting layers are arranged in at least two third secondary sub pixels of the at least one third sub pixel and have strongest luminous characteristic, where the third organic light emitting layers arranged in the at least two third secondary sub pixels are connected with each other such that the gravity center of the displayed image in the organic light emitting diode display device can be balanced and the color mixing in the organic light emitting diode display panel can be avoided, thereby increasing the yield of the organic light emitting diode display device.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

Figure 1A:
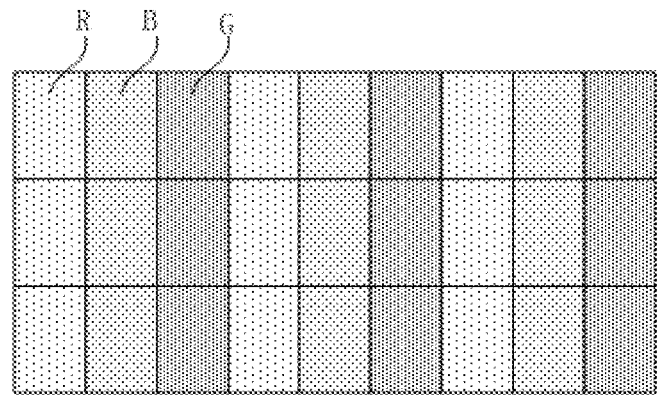
FIG. 1A and FIG. 1B are top views showing the structure of pixel units in an organic light emitting diode display device in the related art.
Figure 1B:
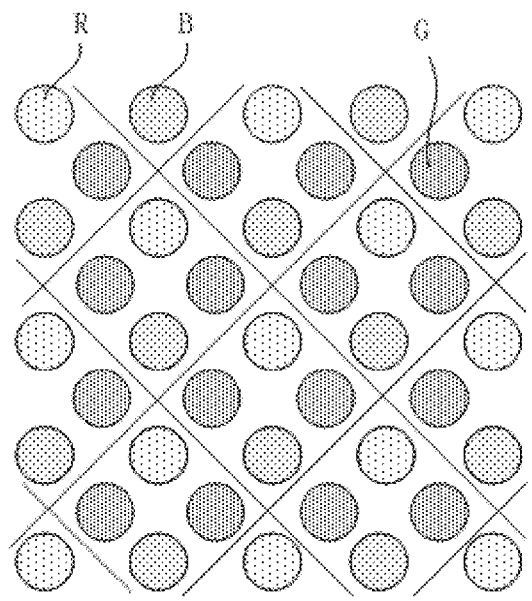

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be further illustrated below in conjunction with specific embodiments and the accompanying drawings. It may be understood that embodiments described herein are for explaining the disclosure rather than limiting the disclosure. In addition, it should be appreciated that partial content associated with the disclosure rather than all content is illustrated in the accompanying drawings for ease of description.

Figure 2:
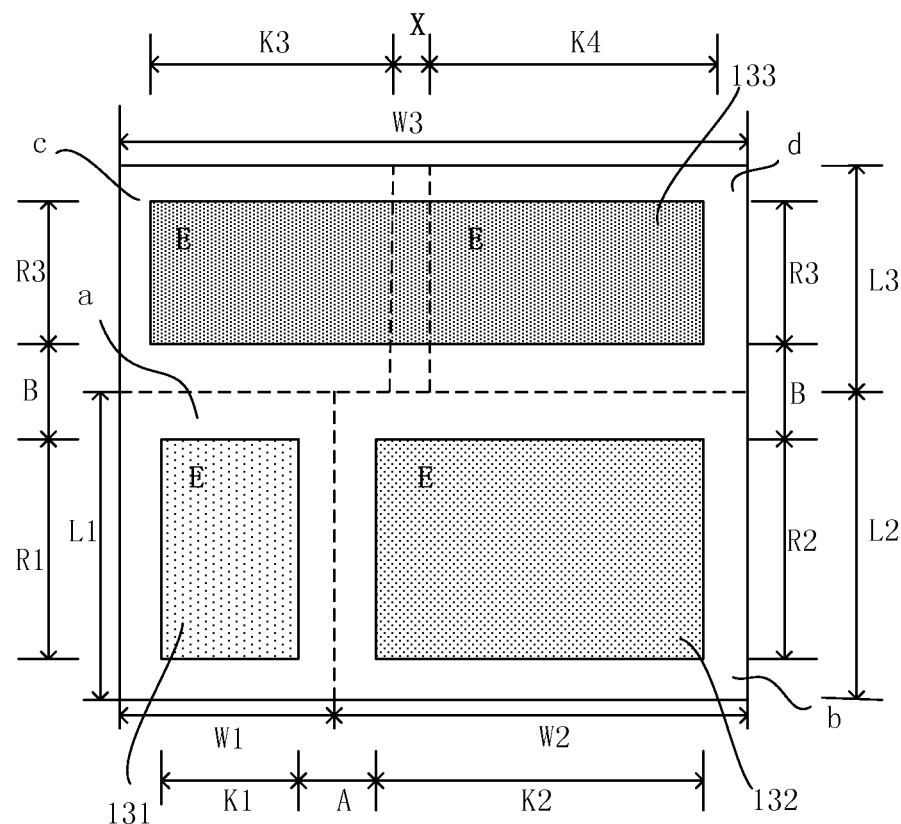
FIG. 2 is a top view showing the structure of an organic light emitting diode display device according to embodiments of the disclosure.
Figure 3A:
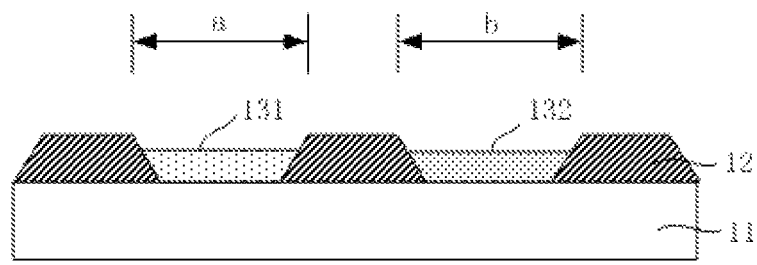
FIG. 3A and FIG. 3B are sectional views showing the structure of an organic light emitting diode display device according to embodiments of the disclosure.
Figure 3B:
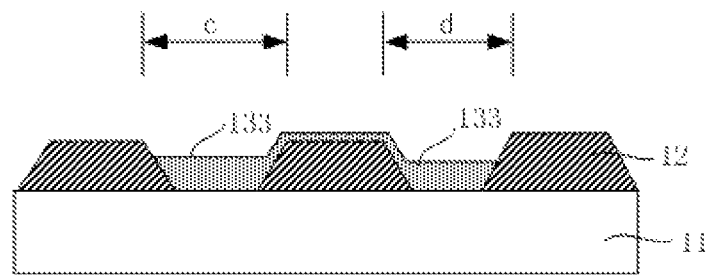

Embodiments of the disclosure provide an organic light emitting diode display device. Referring to FIGS. 2, 3A and 3B, FIG. 2 is a top view showing the structure of an organic light emitting diode display device according to embodiments of the disclosure, and FIG. 3A and FIG. 3B are sectional views showing the structures of an organic light emitting diode display device according to embodiments of the disclosure.

The organic light emitting diode display device includes: a substrate 11; a pixel definition layer 12 located on the substrate 11, where a plurality of pixel units arranged together are defined in the pixel definition layer 12, each of the pixel units includes at least one first sub pixel a, at least one second sub pixel b and at least one third sub pixel, and each of the third sub pixels includes at least two third secondary sub pixels; a first organic light emitting layer arranged in each of the at least one first sub pixel a, where in some embodiments, the first organic light emitting layer is a red organic light emitting layer 131 and includes a first organic light emitting material for emitting light in a first primary color; and a second organic light emitting layer arranged in each of the at least one second sub pixel b, where in some embodiments, the second organic light emitting layer is a blue organic light emitting layer 132 and includes a second organic light emitting material for emitting light in a second primary color. Each of the third sub pixels includes at least two third secondary sub pixels connected with each other. In some embodiments, two third secondary sub pixels c and d are included in the third secondary sub pixel, and third organic light emitting layers are arranged in the third secondary sub pixels c and d, respectively. The third organic light emitting layer is a green organic light emitting layer 133 and includes a third organic light emitting material for emitting light in a third primary color that has the strongest luminous characteristic. The green organic light emitting layers 133 arranged in the third secondary sub pixels c and d are connected with each other.

The substrate 11 may be made of glass or flexible plastic, and the pixel definition layer 12 may be made of an inorganic insulation material such as silicon oxide or silicon nitride, or alternatively may be made of an organic insulation material such as Benzocyclobutene (BCB) or acrylic resin.

As shown in FIGS. 2, 3A and 3B, each of the pixel units includes one first sub pixel a, one second sub pixel b and one third sub pixel with the strongest luminous characteristic, where the third sub pixel includes a third secondary sub pixel c and a third secondary sub pixel d. It should be understood for those skilled in the art that the pixel unit described herein is used to explain the disclosure, but not intended to limit the disclosure. In an actual application, a plurality of third secondary sub pixels with the strongest luminous characteristic may be arranged in the third sub pixel of the pixel unit according to actual requirements.

As shown in FIGS. 2, 3A and 3B, the first sub pixel a is embodied as a red sub pixel, the second sub pixel b is embodied as a blue sub pixel, and the third sub pixel is embodied as a green sub pixel, which is an example of the configuration of the first sub pixel a, the second sub pixel b and the third sub pixel. In other examples, it is also possible that the first sub pixel a is embodied as a blue sub pixel, the second sub pixel b is embodied as a red sub pixel and the third sub pixel is embodied as a green sub pixel, which is not limited thereto. In addition, for ease of description, the description below is made with the configuration that the first sub pixel a is embodied as a red sub pixel, the second sub pixel b is embodied as a blue pixel and the third sub pixel is embodied as a green sub pixel.

The organic light emitting diode display device includes a plurality of pixel units, and each of the plurality of pixel units includes a plurality of sub pixels, each of which has a rectangle shape. As shown in FIG. 2, a red sub pixel a has a rectangle shape with a length W1 and a width L1, a blue sub pixel b has a rectangle shape with a length W2 and a width L2, and a green sub pixel (including a green secondary sub pixel c and a green secondary sub pixel d) has a rectangle shape with a length W3 and a width L3. Each of the sub pixels includes an active region E and an inactive region outside of the active region E. Specifically, the active region E is a region provided with an organic light emitting layer, and the inactive region is a region of the pixel definition layer 12 that surrounds the active region E, where a red organic light emitting layer 131, a blue organic light emitting layer 132 and a green organic light emitting layer 133 all are formed in the active regions E. A vapor deposition mask process is employed in a manufacturing process for the pixel unit, i.e. the pixel unit is shielded by vapor deposition masks to form the red sub pixel a, the blue sub pixel b, and the green secondary sub pixels c and d. The inactive region between the active region E of the red sub pixel a and the active region E of the blue sub pixel b has a first span A. The inactive region between the active region E of the green sub pixel (including the green secondary sub pixels c and d) and the active region E of the red sub pixel a has a second space B, and the inactive region between the active region E of the green sub pixel and the active region E of the blue sub pixel b likewise has the second span B. The sizes of the first span A and the second span B depend on the precision of the fine metal masks. The active region E of the red sub pixel a has a length K1 and a width R1, the active region E of the blue sub pixel b has a length K2 and a width R2, the active region E of the red sub pixel a is spaced apart from the active region E of the blue sub pixel b by the first span A, the active region E of the green secondary sub pixel c is spaced apart from the active region E of the red sub pixel a by the second span B, and the active region E of the green secondary sub pixel d is spaced apart from the active region E of the blue sub pixel b by the second span B. The red organic light emitting layer 131, the blue organic light emitting layer 132 and the green organic light emitting layer 133 are formed by organic light emitting materials deposited by means of vapor deposition through the fine metal masks.

It is noted that the active region of the green sub pixel includes two active regions, i.e. the active region E of the green secondary sub pixel c and the active region E of the green secondary sub pixel d, where the active region E of the green secondary sub pixel c has a length K3 and a width R3, the active region E of the green secondary sub pixel d has a length K4 and also the width R3, and the two active regions of the green secondary sub pixels c and d are spaced apart from each other by a third span X which is the span of the inactive region between the green secondary sub pixel c and the green secondary sub pixel d. The size of the third span X depends on the distance between openings of a first mask used for the pixel definition layer 12. Preferably, the third span X is less than the first span A or the second span B.

In the disclosure, the red organic light emitting layer 131 in the red sub pixel a and the blue organic light emitting layer 132 in the blue sub pixel b are formed prior to forming the green organic light emitting layers 133 in the green secondary sub pixels c and d, or alternatively the green organic light emitting layers 133 in the green secondary sub pixels c and d are formed prior to forming the red organic light emitting layer 131 in the red sub pixel a and the blue organic light emitting layer 132 in the blue sub pixel b, which is not limited herein.

Figure 4:
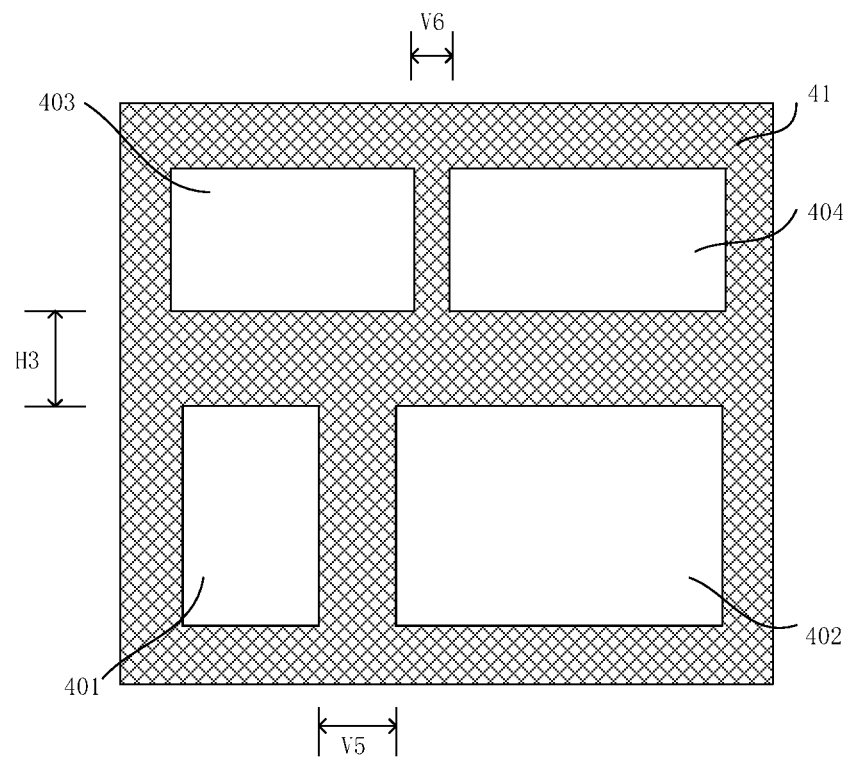
FIG. 4 is a schematic view of a mask for forming a pixel definition layer in embodiments of the disclosure.
Figure 5A:
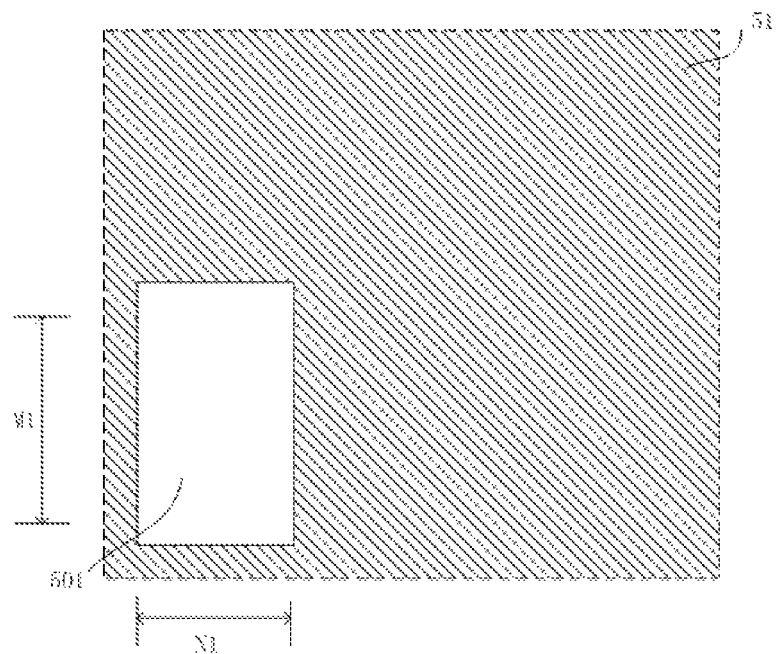
FIG. 5A is a schematic view of a first mask for forming a red organic light emitting layer in embodiments of the disclosure.
Figure 5B:
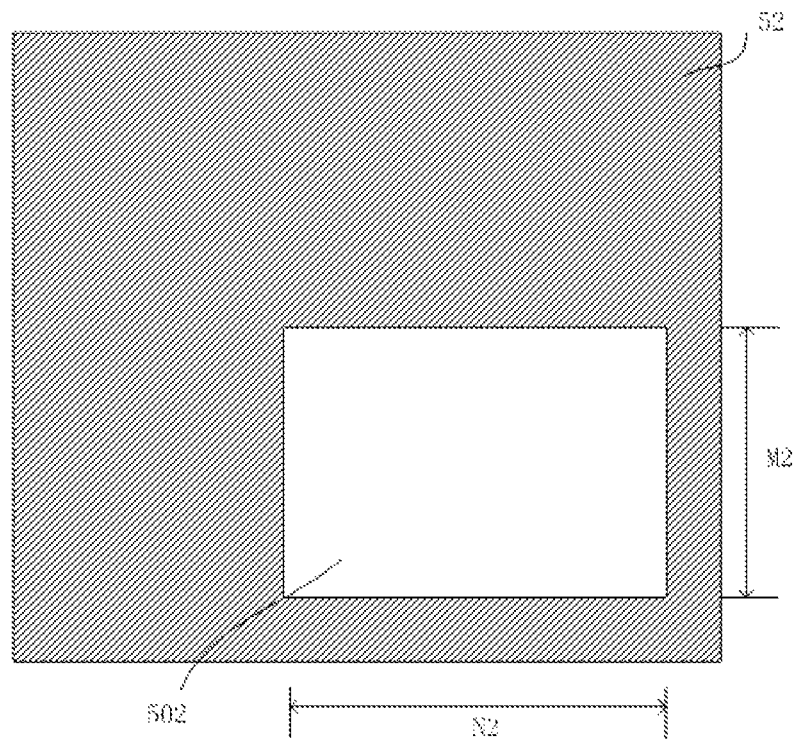
FIG. 5B is a schematic view of a second mask for forming a blue organic light emitting layer in embodiments of the disclosure.
Figure 5C:
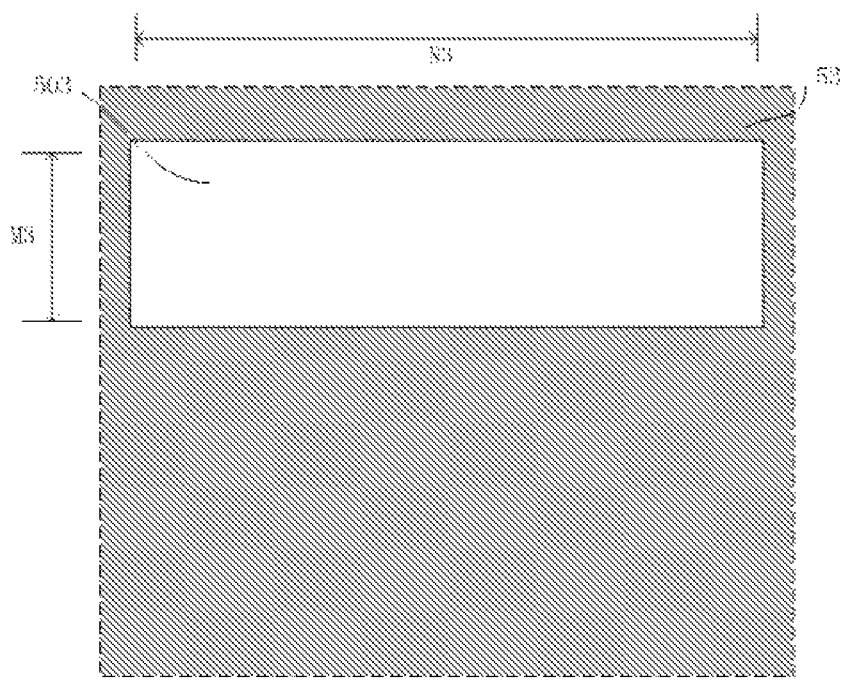
FIG. 5C is a schematic view of a third mask for forming a green organic light emitting layer in embodiments of the disclosure.

Reference is made below to FIGS. 4, 5A to 5C, where FIG. 4 is a schematic view of a first mask for forming a pixel definition layer in embodiments of the disclosure, FIG. 5A is a schematic view of a second mask for forming a red organic light emitting layer in embodiments of the disclosure, FIG. 5B is a schematic view of a third mask for forming a blue organic light emitting layer in embodiments of the disclosure, and FIG. 5C is a schematic view of a fourth mask for forming a green organic light emitting layer in embodiments of the disclosure As shown in FIG. 4, a first mask 41 is used to form a pixel definition layer 12. A plurality of pixel units arranged together are formed in the pixel definition layer 12, each of the pixel units includes a red sub pixel a, a blue sub pixel b and a green sub pixel, and the green sub pixel includes a green secondary sub pixel c and a green secondary sub pixel d. The first mask 41 includes two openings (i.e. an opening 403 and an opening 404) for defining the green secondary sub pixels c and d, respectively, and the distance V6 between the opening 403 and the opening 404 corresponds to the third span X between the active region E of the green secondary sub pixel c and the active region E of the secondary sub pixel d. The first mask 41 further includes an opening 401 for defining the red sub pixel a and an opening 402 for defining the blue sub pixel b, and the distance V5 between the opening 401 and the opening 402 corresponds to the first span A between the active region E of the red sub pixel a and the active region E of the blue sub pixel b. The distance H3 between the opening 403 and the opening 401 of the first mask 41 corresponds to the second span B between the active region E of the green secondary sub pixel c and the active region E of the red sub pixel a, and likewise, the distance H3 between the opening 404 and the opening 402 of the first mask 41 corresponds to the second span B between the active region E of the green secondary sub pixel d and the active region E of the blue sub pixel b. The value of the first span A is equal to the minimal value of an inactive region formed when forming the red organic light emitting layer 131 and the blue organic light emitting layer 132 by vapor deposition, the minimal value of an inactive region depends on a manufacturing process and is used to determine the distance between the red sub pixel a and the blue sub pixel b to decrease the area of the inactive region, where the manufacturing process can be a deposition process, a sputtering process or a vapor deposition process, and the value of the second span B is equal to the minimal value of an inactive region formed when forming the green organic light emitting layer 133, the red organic light emitting layer 131 and the blue organic light emitting layer 132 by vapor deposition, the minimal value of an inactive region depends on a manufacturing process and is used to determine the distance between the red sub pixel a and the green secondary sub pixel d or the distance between the blue sub pixel b and the green secondary sub pixel d to decrease the area of the inactive region, so that the area of the inactive region is decreased and the area of the active region is increased in the pixel unit, thereby increasing the aperture ratio of the pixel unit and decreasing the power consumption of the display device, where the manufacturing process can be a deposition process, a sputtering process or a vapor deposition process. It is noted that the value of the first span A and the value of the second span B may be the same as each other or different from each other, which is not limited thereto.

As shown in FIG. 5A, a second mask 51 is used to form the red organic light emitting layer 131, and an alignment position of the second mask 51 for forming the red organic light emitting layer 131 is different from an alignment position of a third mask 52 for forming the blue organic light emitting layer 132 and an alignment position of a fourth mask 53 for forming the green organic light emitting layer 133. In the pixel unit, an opening 501 in the second mask 51 corresponds to the red organic light emitting layer 131, and has a first length N1 which is larger than or equal to the length K1 of the active region E of the red sub pixel a, and also has a first width M1 which is larger than or equal to the width R1 of the active region E of the red sub pixel a.

As shown in FIG. 5B, a third mask 52 is used to form the blue organic light emitting layer 132, and the alignment position of the third mask 52 for forming the blue organic light emitting layer 132 is different from an alignment position of the second mask 51 for forming the red organic light emitting layer 131 and an alignment position of the fourth mask 53 for forming the green organic light emitting layer 133. In the pixel unit, an opening 502 in the third mask 52 corresponds to the blue organic light emitting layer 132, and the opening 502 of the third mask 52 has a second opening length N2, the second opening length N2 is larger than or equal to the length K2 of the active region E of the blue sub pixel b. In addition, the opening 502 of the third mask 52 has a second opening width M2, and the second opening width M2 is larger than or equal to the width R2 of the active region E of the blue sub pixel b.

As shown in FIG. 5C, the fourth mask 53 is used to form the green organic light emitting layer 133, and the alignment position of the fourth mask 53 for forming the green organic light emitting layer 133 is different from an alignment position of the second mask 51 for forming the red organic light emitting layer 131 and an alignment position of the third mask 52 for forming the blue organic light emitting layer 132. In the pixel unit, an opening 503 in the fourth mask 53 corresponds to the green organic light emitting layer 133, and the opening 503 of the fourth mask 53 has a third opening length N3 which is larger than or equal to the sum of the length K3 of the active region E of the green secondary sub pixel c, the length K4 of the active region E of the green secondary sub pixel d and the third span X (i.e. $N3 \geq K3+K4+X$), and the opening 503 of the fourth mask 53 has a third opening width M3, and the third opening width M3 is larger than or equal to the width R3 of the active regions E of the green secondary sub pixel c and the green secondary sub pixel d.

In some embodiments, in a first aspect, the plurality of pixel units are arranged close to each other so that each of the pixel units is surrounded by other pixel units which are distributed evenly at the peripheral of the pixel unit, and hence the pixel rendering algorithm is easily to implement, thereby improving the display effect because the pixel rendering algorithm is directly correlated with the display effect. In a second aspect, since the green organic light emitting layers respectively in the green secondary sub pixel c and the green secondary sub pixel d are connected with each other, the difficulty for manufacturing the mask is decreased in terms of the manufacturing process, and the color mixing in the organic light emitting diode display panel caused during the vapor deposition can be avoided, thereby increasing the yield of the organic light emitting diode display device. In a third aspect, as described above, the green organic light emitting material has the strongest luminous characteristic and hence imposes the most intensive stimulation to user's eyes, which directly influences the judgment made by the user's eyes on a spatial position of the displayed image; in this case, under the conditions of the same processing condition limitations and the same area and number of the pixel units, two green sub pixel regions are provided in each pixel unit, so that the gravity center of a displayed image is accurate, thereby increasing the resolution of the displayed image.

Figure 6A:
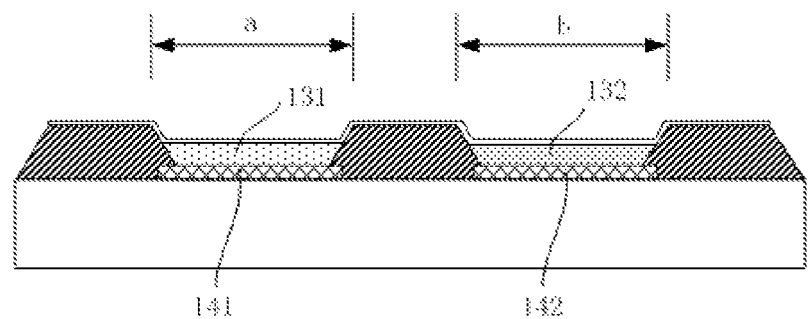
FIG. 6A and FIG. 6B are sectional views showing the structure of an organic light emitting diode display device according to embodiments of the disclosure.
Figure 6B:
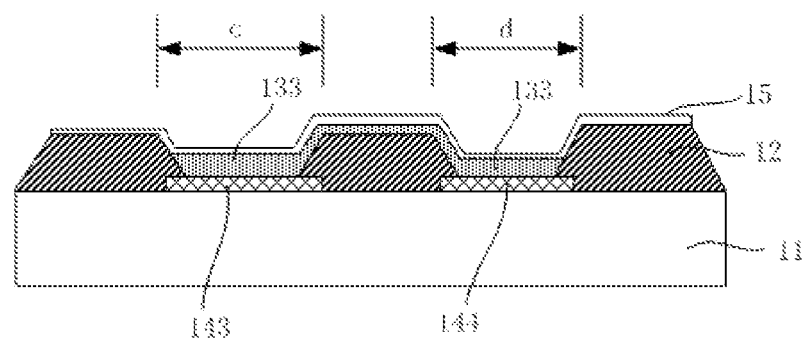

Referring to FIGS. 6A and 6B based on the structures shown in FIGS. 3A and 3B, the organic light emitting diode display device shown in FIGS. 6A and 6B includes a first anode 141 disposed between the pixel definition layer 12 and the substrate 11 within the red sub pixel a, a second anode 142 disposed between the pixel definition layer 12 and the substrate 11 within the blue sub pixel b, a third anode 143 disposed between pixel definition layer 12 and the substrate 11 within the green secondary sub pixel c, and a fourth anode 144 disposed between the pixel definition layer 12 and the substrate 11 in the green secondary sub pixel d. The red organic light emitting layer 131 is located on the first anode 141, the blue organic light emitting layer 132 is located on the second anode 142, and the green organic light emitting layers 133 are located on the third anode 143 and the fourth anode 144, respectively; the lower surfaces of the first anode 141, the second anode 142, the third anode 143 and the fourth anode 144 are connected with thin film transistors (not shown in FIGS. 6A and 6B), respectively. The thin film transistors may be driving transistors. The organic light emitting diode display device further includes a semi-transparent cathode 15 located on the red organic light emitting layer 131, the blue organic light emitting layer 132 and the green organic light emitting layers 133.

The pixel unit is configured to display by receiving a signal from a pixel driving circuit, and the pixel driving circuit is configured to selectively turn on or turn off the driving transistor. The driving transistor transfers a preset potential to the anode, so that an electric potential difference is formed between the anode and the semi-transparent cathode 15. Then the electrons and holes are injected into an organic light emitting layer from the semi-transparent cathode 15 and the anode, respectively, to activate the organic light emitting material in the organic light emitting layer to emit light. In some embodiments, since the green organic light emitting layer in the green secondary sub pixel c is connected with the third anode 143 and the green organic light emitting layer in the green secondary sub pixel d is connected with the fourth anode 144, two pixel driving circuits are required to drive the green secondary sub pixel c and the green secondary sub pixel d, respectively. As such, it is noted that at least two pixel driving circuits are required in the case that the green sub pixel includes at least two green secondary sub pixels, in order to drive the at least two green secondary sub pixels, respectively.

It should be understood by those skilled in the art that FIGS. 3A, 3B, 6A and 6B schematically show film structures on a substrate in an organic light emitting diode display device. Accordingly, due to different structures of the organic light emitting diode display device, there are different film structures on the substrate in the organic light emitting diode display device. In some embodiments, the films on the substrate are not specifically limited, as long as the third organic light emitting layers with the strongest luminous characteristic which are respectively located within the at least two third secondary sub pixels are connected with each other. Therefore, the structure of the embodiments is not only limited to FIGS. 3A, 3B, 6A and 6B.

In the above-described organic light emitting diode display device, the areas of the corresponding sub pixels of the pixel unit may be different from one another. In some embodiments, the area of the blue sub pixel 132 is larger than that of the red sub pixel 131 considering that the luminous efficiency of the blue organic light emitting material is lower, so that the defect of the lower luminous efficiency of the blue organic light emitting material can be overcome by increasing the area of the blue sub pixel 132, thereby increasing the lifetime of the organic light emitting diode display device.

Figure 7A:
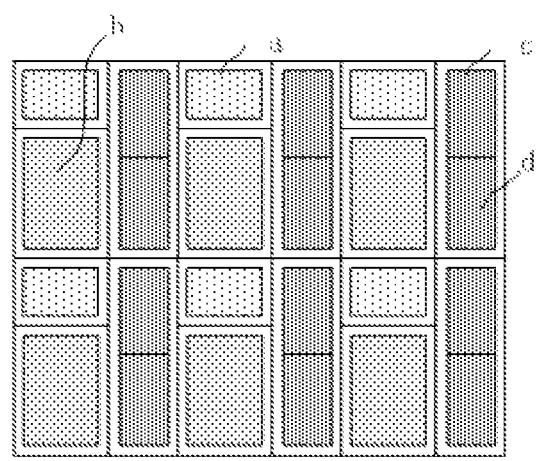
FIG. 7A and FIG. 7B are top views showing the structure of pixel units of an organic light emitting diode display device according to embodiments of the disclosure.
Figure 7B:
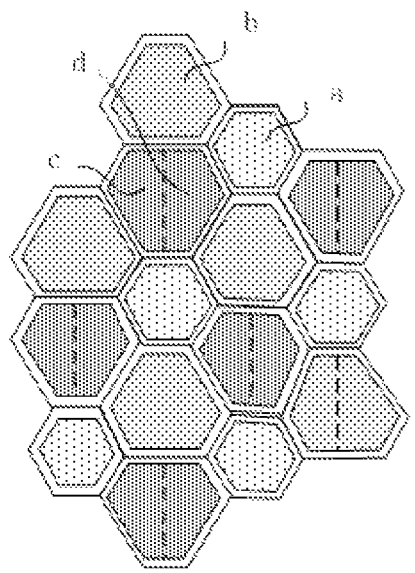

In the above organic light emitting diode display device, the areas and shapes of the corresponding sub pixels of the pixel unit may be different from one another. FIGS. 7A and 7B are top views showing the structure of pixel units of an organic light emitting diode display device according to embodiments of the disclosure. As shown in FIGS. 7A and 7B, preferably, the red sub pixel a, the blue sub pixel b, the green secondary sub pixel c and the green secondary sub pixel d all have polygonal shapes, and particularly the shapes of the red sub pixel a, the blue sub pixel b, the green secondary sub pixel c and the green secondary sub pixel d may be the same with each other. In some embodiments, the red sub pixel a, the blue sub pixel b, the green secondary sub pixel c and the green secondary sub pixel d may have a rectangular shape (as shown in FIG. 7A) or a hexagonal shape (as shown in FIG. 7B). As such, the pixel units are arranged close to each other, each of the pixel units is surrounded by other pixel units which are distributed evenly at the peripheral of the pixel unit, and a larger aperture ratio of the pixel unit can be obtained by the increased internal angle of each of the sub pixels.

Figure 8:
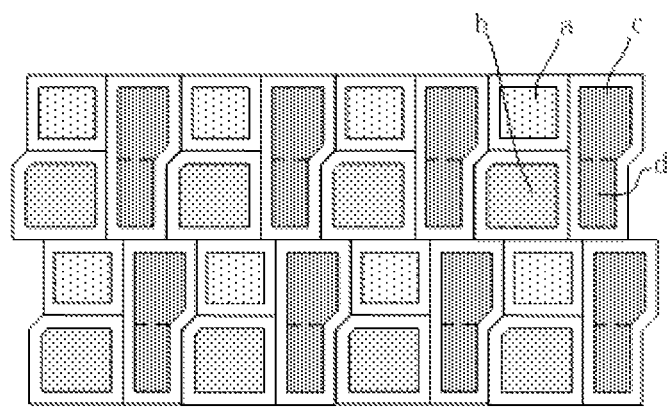
FIG. 8 is a top view showing another structure of pixel units of an organic light emitting diode display device according to embodiments of the disclosure.

In addition to the structures of the pixel units shown in FIG. 7A and 7B, FIG. 8 is a top view showing another structure of pixel units of an organic light emitting diode display device according to embodiments of the disclosure. As shown in FIG. 8, a red sub pixel a, a blue sub pixel b, a green secondary sub pixel c and a green secondary sub pixel d all have a polygonal shape, and the shapes of the red sub pixel a, the blue sub pixel b, the green secondary sub pixel c and the green secondary sub pixel d may be different from each other. Preferably, an internal angle of each of the red sub pixel a, the blue sub pixel b, the green secondary sub pixel c and the green secondary sub pixel d is larger than or equal to 90°. For example, the red sub pixel a has a rectangular shape, the blue sub pixel b has a pentagonal shape with three right angles and two obtuse angles, and the green secondary sub pixels c and d each have a hexagonal shape with four right angles and two obtuse angles. Also, the pixel units are arranged close to each other, each of the pixel units is surrounded by other pixel units which are distributed evenly at the peripheral of the pixel unit, and the aperture ratio of the pixel unit can be increased by arranging an internal angle of each of the sub pixels to be larger than or equal to 90°, thereby increasing the luminous efficiency of the organic light emitting diode display device and reducing the power consumption of the organic light emitting diode display device. In addition, such configuration also is advantageous in that the spatial arrangement of the pixel units is simple, the pixel rendering effect is good, the spatial symmetry of the pixels is good and the cost is relatively low.

With the organic light emitting diode display device according to embodiments of the disclosure, the gravity center of the displayed image in the organic light emitting diode display device can be balanced and the color mixing in the organic light emitting diode display panel can be avoided, thereby increasing the yield of the organic light emitting diode display device. In addition, the lifetime of the organic light emitting diode display device is prolonged by maximizing the area of the blue sub pixel. Further, the aperture ratio of the pixel unit is increased by arranging the internal angle of the sub pixel to be larger than or equal to 90°, and accordingly, the spatial symmetry of the pixels is good and the cost is relatively low.

Figure 9:
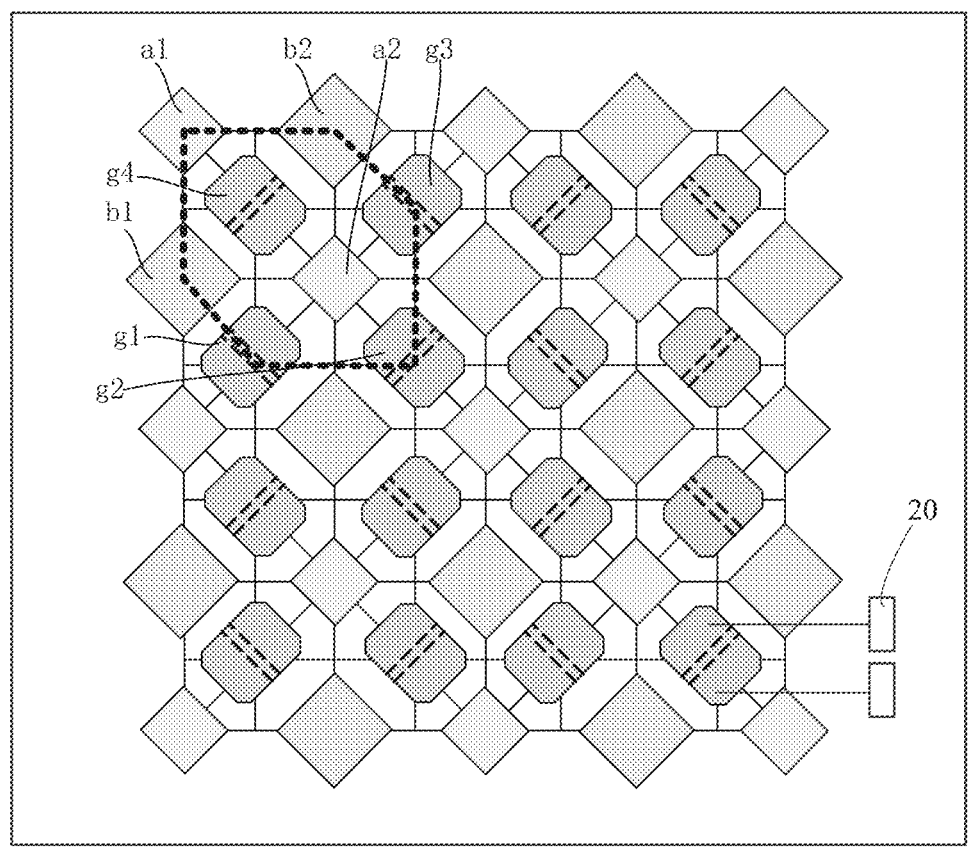
FIG. 9 is a top view showing the structure of an organic light emitting diode display device according to embodiments of the disclosure.

FIG. 9 is a top view showing the structure of an organic light emitting diode display device according to embodiments of the disclosure. As shown in FIG. 9, the organic light emitting diode display device includes: a substrate (not shown in FIG. 9); a pixel definition layer located on the substrate (not shown in FIG. 9), where the pixel definition layer defines a plurality of pixel units arranged together in the pixel definition layer, each of the pixel units includes two first sub pixels (a1 and a2 in FIG. 9), two second sub pixels (b1 and b2 in FIG. 9) and four third sub pixels (g1, g2, g3 and g4 in FIG. 9), each of the third sub pixels includes two third secondary sub pixels (two parts spaced apart by dotted line in FIG. 9); a first organic light emitting layer arranged in each of the two first sub pixels, where in some embodiments, the first organic light emitting layer is a red organic light emitting layer, and the red organic light emitting layer includes a red organic light emitting material to emit a red light; a second organic light emitting layer arranged in each of the two second sub pixels, where in some embodiments, the second organic light emitting layer is a blue organic light emitting layer, and the blue organic light emitting layer includes a blue organic light emitting material to emit a blue light. Green organic light emitting layers are arranged in two third secondary sub pixels included in each third sub pixel, and the green organic light emitting layer includes a green organic light emitting material to emit a green light, where the green organic light emitting layers respectively arranged in the two third secondary sub pixels of each third sub pixel are connected with other.

In some embodiments, the first sub pixels a1 and a2 are embodied as a red sub pixel, the second sub pixels b1 and b2 are embodied as a blue sub pixel, the third sub pixels g1, g2, g3 and g4 are embodied as a green sub pixel, which is an example for the configuration of the first sub pixels a1 and a2, the second sub pixels b1 and b2 and the third sub pixels g1, g2, g3 and g4. In other examples, it is also possible that the first sub pixels a1 and a2 are embodied as a blue sub pixel, the second sub pixels b1 and b2 are embodied as a red sub pixel, and the third sub pixels g1, g2, g3 and g4 are embodied as a green sub pixel, which is not limited thereto. Moreover, for ease of description, the configuration that the first sub pixels a1 and a2 are red sub pixels, the second sub pixels b1 and b2 are blue pixels and the third sub pixels g1, g2, g3 and g4 are green pixels is illustrated as an example below.

In some embodiments, the area of any of the blue sub pixels b1 and b2 is larger than the area of any of the red sub pixels a1 and a2 so as to increase the lifetime of the organic light emitting diode display device. The red sub pixels a1 and a2 and the blue sub pixels b1 and b2 each may have a rectangular shape, and the green sub pixels g1, g2, g3 and g4 each may have an octagonal shape which is derived from a rectangle with its four internal angles being cut off, resulting in an advantage that the aperture ratio of the green sub pixel can be increased. The green secondary sub pixels in each green sub pixel are driven by the two driving circuits, respectively, that is, the four green sub pixels g1, g2, g3 and g4 are driven by eight driving circuits 20 in FIG. 9.

In some embodiments, the pixel unit has a hexagonal shape. In some embodiments, in consideration of factors such as process, appearance and display effect, the pixel unit has a hexagonal shape which is axisymmetric in some embodiments. The center of one red sub pixel a1 is located at one vertex of the hexagonal shape, the centers of two blue sub pixels b1 and b2 are respectively located at two vertexes of the hexagonal shape adjacent to the one vertex including the center of the red sub pixel a1, the centers of three green sub pixels g1, g2 and g3 are respectively located at the remaining three vertexes of the hexagonal shape, the center of another green sub pixel g4 is located at a midpoint of a diagonal connecting the two vertexes including the centers of the two blue sub pixels b1 and b2, and the center of another red sub pixel a2 is located at a midpoint of a diagonal connecting the two vertexes including the centers of the green sub pixels g1 and g3. In some embodiments, a distance between the center of each green sub pixel in a pixel unit and the center of a red sub pixel which is located in the same pixel unit as and adjacent to the green sub pixel is equal to a distance between the center of the green sub pixel and the center of a red sub pixel in an pixel unit adjacent to the pixel unit containing the green sub pixel, and a distance between the center of each green sub pixel in a pixel unit and the center of a blue sub pixel which is located in the same pixel unit as and adjacent to the green sub pixel is equal to a distance between the center of the green sub pixel and the center of a blue sub pixel in an pixel unit adjacent to the pixel unit containing the green sub pixel. The center of the green sub pixel is a central point of a geometry formed by two green secondary sub pixels. In some embodiments, the areas of the red sub pixels a1 and a2, the blue sub pixels b1 and b2, and the green sub pixels g1, g2, g3 and g4 can be adjusted flexibly, so that identical voltages are applied to the red sub pixels, the blue sub pixels and the green sub pixels through the thin film transistors, thereby balancing the display effects of the red sub pixels, the blue sub pixels and the green sub pixels in order to enable the organic light emitting diode display device to emit white light.

In some embodiments, the distance between openings of the first mask for forming the pixel definition layer is equal to the minimal value of an inactive region formed when forming the red organic light emitting layer, the blue organic light emitting layer and the green organic light emitting layer by vapor deposition, respectively. For example, the distance between the openings of the first mask which are used to define the red sub pixel a1 and the green sub pixel g4 is equal to the minimal value of the inactive region formed when forming the red organic light emitting layer and the green organic light emitting layer by vapor deposition, the minimal value of the inactive region depends on a manufacturing process and is used to determine the distance between the red sub pixel a1 and the green sub pixel g4 to decrease the area of the inactive region, and the manufacturing process can be a deposition process, a sputtering process or a vapor deposition process; the distance between the openings of the first mask which are used for defining the blue sub pixel b1 and the green sub pixel g4 is equal to the minimal value of an inactive region formed when forming the blue organic light emitting layer and the green organic light emitting layer by vapor deposition, the minimal value of the inactive region depends on by the manufacturing process and is used to determine the distance between the blue sub pixel b1 and the green sub pixel g4 to decrease the area of the inactive region, where the manufacturing process can be a deposition process, a sputtering process or a vapor deposition process; and the distance between the openings of the first mask which are used for defining the red sub pixel a1 and the blue sub pixel b1 is equal to the minimal value of an inactive region formed when forming the red organic light emitting layer and the blue organic light emitting layer by vapor deposition, the minimal value of the inactive region depends on the manufacturing process and is used to determine the distance between the red sub pixel a1 and the blue sub pixel b1 to decrease the area of the inactive region, where the manufacturing process can be a deposition process, a sputtering process or a vapor deposition process. For the structure of the first mask for forming the pixel definition layer, the structure of the second mask for forming the red organic light emitting layer, the structure of the third mask for forming the blue organic light emitting layer and the structure of the fourth mask for forming the green organic light emitting layer, reference can be made to the first mask 41, the second mask 51, the third mask 52 and the fourth mask 53 described in the above embodiments, which is not repeatedly described again herein.

In some embodiments, in a first aspect, the proportions of the areas of the red sub pixels, the blue sub pixels and the green sub pixels can be adjusted flexibly, so that the display effects of the red sub pixels, the blue sub pixels and the green sub pixels are balanced; in a second aspect, the pixel units are arranged close to each other and each of the pixel units is surrounded by other pixel units which are distributed evenly at the peripheral of the pixel unit, thus the pixel rendering algorithm can be easily implemented, and the display effect of the display panel can be improved since the pixel rendering algorithm is directly correlated with the display effect; in a third aspect, in terms of the manufacturing process, since the green organic light emitting layers in the green secondary sub pixel c and the green secondary sub pixel d are connected with each other, the difficulty for manufacturing the mask is decreased and the color mixing phenomenon in the organic light emitting diode display panel can be avoided during the vapor deposition, thereby increasing the yield of the organic light emitting diode display device; in a fourth aspect, the green organic light emitting material has the highest luminous characteristic and imposes the most intensive stimulation to a user's eyes, which directly influences the judgment made by the user's eyes on a spatial position of the displayed image; in this case, under the conditions of the same processing condition limitations and the same area and number of the pixel units, two green sub pixel regions are provided in each pixel unit, so that the gravity center of a displayed image is accurate, thereby increasing the resolution of the displayed image.

Figure 10:
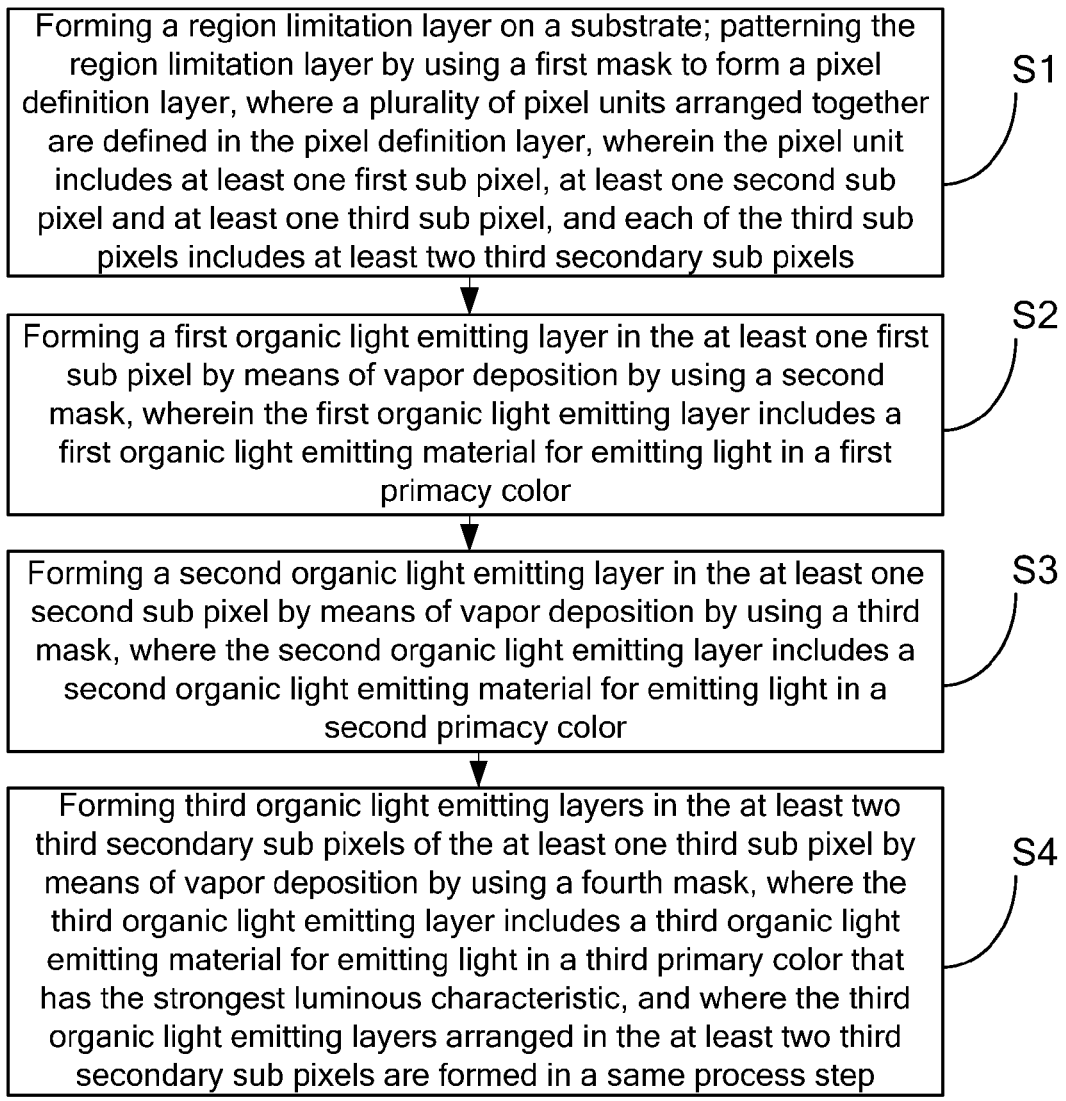
FIG. 10 is a flow chart of a manufacturing method of an organic light emitting diode display device according to embodiments of the disclosure.

FIG. 10 is a flow chart of a manufacturing method of an organic light emitting diode display device according to embodiments of the disclosure, and the method is used to manufacture the organic light emitting diode display device in the above embodiments. As shown in FIG. 10, a manufacturing method of an organic light emitting diode display device includes Steps S1 to S4. It is noted that the labels S1 to S4 herein are only used to distinguish between the steps, but not to limit the sequence of the steps. In embodiments of the disclosure, the sequence of the steps can be adjusted according to process adjustment. The manufacturing method of the organic light emitting diode display device includes:

Step S1 includes forming a region limitation layer on a substrate; patterning the region limitation layer by using a first mask to form a pixel definition layer, where the pixel definition layer defines a plurality of pixel units arranged together are defined in the pixel definition layer, where the pixel unit includes at least one first sub pixel, at least one second sub pixel and at least one third sub pixel, and each of the third sub pixels includes at least two third secondary sub pixels.

In Step S1, the substrate 11 can be made of glass or flexible plastic, and the pixel definition layer 12 can be made of an in-organic insulation material such as silicon oxide or silicon nitride, or can be made of an Organic insulation material such as Benzocyclobutene (BCB) or acrylic resin.

In some embodiments, the at least two third secondary sub pixels in each third sub pixel are driven by at least two driving circuits, respectively. For example, one pixel unit includes four third sub pixels, and each of the third sub pixels includes two third secondary sub pixels, and in this case, eight driving circuits are required to drive the eight third secondary sub pixels, respectively.

Step S2 includes forming a first organic light emitting layer in the at least one first sub pixel by means of vapor deposition by using a second mask, wherein the first organic light emitting layer includes a first organic light emitting material for emitting light in a first primacy color.

In Step S2, the first sub pixel may be a red sub pixel, and accordingly the first organic light emitting layer is a red organic light emitting layer. Alternatively, the first sub pixel may be a blue sub pixel, and accordingly the first organic light emitting layer is a blue organic light emitting layer, which is not limited hereto.

Step S3 includes forming a second organic light emitting layer in the at least one second sub pixel by means of vapor deposition by using a third mask, where the second organic light emitting layer includes a second organic light emitting material for emitting a second primacy color.

In Step S3, the second sub pixel may be a blue sub pixel, and accordingly the second organic light emitting layer is a blue organic light emitting layer. Alternatively, the second sub pixel may be a red sub pixel, and accordingly the second organic light emitting layer is a red organic light emitting layer, which is not limited hereto.

Step S4 includes forming third organic light emitting layers in the at least two third secondary sub pixels by means of vapor deposition by using a fourth mask, where the third organic light emitting layers include a third organic light emitting material for emitting light in a third primary color with the strongest luminous characteristic, and where the third organic light emitting layers provided in the at least two third secondary sub pixels are formed in a same process step, where at least two openings of the first mask which are used to form at least two third sub mutes in the at least one third sub pixel correspond to one opening of the fourth mask which is used to form the third organic light emitting layer.

The manufacturing method of the organic light emitting diode display device provided by embodiments of the disclosure is described below in combination with FIGS. 2, 3A, 3B, 4 and 5A-5C.

The method includes growing or depositing a region limitation layer on a substrate and then forming a pixel definition layer 12 shown in FIGS. 3A and 3B by using a first mask 41 shown in FIG. 4 and a photoetching process, where a plurality of pixel units arranged together are defined in the pixel definition layer 12. As shown in FIG. 2, each of the pixel units includes one red sub pixel a, one blue sub pixel b and one green sub pixel, and the green sub pixel includes two green secondary sub pixels (a green secondary sub pixel c and a green secondary sub pixel d). The first mask 41 defines the distance between the openings 401 forming the red sub pixel a and the opening 402 forming the blue sub pixel b to be equal to the minimal value of an inactive region formed when forming the red organic light emitting layer 131 and the blue organic light emitting layer 132 by vapor deposition, the minimal value of the inactive region depends on a manufacturing process and is used to determine the distance between the red sub pixel a and the blue sub pixel b to decrease the area of the inactive region, where the manufacturing process can be a deposition process, a sputtering process or a vapor deposition process, the first mask 41 defines the distance between the opening 403 forming the green secondary sub pixel c and the opening 401 forming the red sub pixel a to be equal to the minimal value of an inactive region formed when forming the green organic light emitting layer 133 and the red organic light emitting layer 131 by vapor deposition, the minimal value of the inactive region depends on the manufacturing process and is used to determine the distance between the green secondary sub pixel c and the red sub pixel a to decrease the area of the inactive region, where the manufacturing process can be a deposition process, a sputtering process or a vapor deposition process, and the first mask 41 defines the distance between the opening 404 forming the green secondary sub pixel d and the opening 402 forming the blue sub pixel b to be equal to the minimal value of an inactive region formed when forming the red organic light emitting layer 133 and the blue organic light emitting layer 132 by vapor deposition, the minimal value of the inactive region depends on the manufacturing process and is used to determine the distance between the green secondary sub pixel d and t blue sub pixel b to decrease the area of the inactive region, where the manufacturing process can be a deposition process, a sputtering process or a vapor deposition process.

Then, the method includes forming a red organic light-emitting layer 131 in a red sub pixel a defined in the pixel definition layer 12 as shown in FIG. 3A by means of vapor deposition by using the second mask 51 shown in FIG. 5A, where the alignment position of the second mask 51 for forming the red organic light-emitting layer 131 is different from both the alignment position of the third mask 52 shown in FIG. 5B for forming the blue organic light-emitting layer 132 and the alignment position of the fourth mask 53 shown in FIG. 5C for forming the green organic light-emitting layer 133, and the red organic light-emitting layer includes a red organic light-emitting material for emitting red light.

Thirdly, the method includes forming a blue organic light-emitting layer 132 in a blue sub pixel b defined in the pixel definition layer 12 as shown in FIG. 3A by means of vapor deposition by using the third mask 52 shown in FIG. 5A, where the alignment position of the third mask 52 for forming the blue organic light-emitting layer 132 is different from both the alignment position of the second mask 51 shown in FIG. 5C for forming the red organic light-emitting layer 131 and the alignment position of the fourth mask 53 shown in FIG. 5C for forming the green organic light-emitting layer 133, and the blue organic light-emitting layer includes a blue organic light-emitting material for emitting blue light.

Fourthly, the method includes forming a green organic light-emitting layer 133 within a green sub pixel (including a green secondary sub pixel c and a green secondary sub pixel d) which is defined by the pixel definition layer 12 shown in FIG. 3B by means of vapor deposition by using a fourth mask 53 shown in FIG. 5C. The shape of the opening of the fourth mask is a long strip shape, where the alignment position of the fourth mask 53 for forming the green organic light-emitting layer 133 is different from the both alignment position of the second mask 51 for forming the red organic light-emitting layer 131 and the alignment position of the third mask 52 for forming the blue organic light-emitting layer 132, and the green organic light-emitting layer includes a green organic light-emitting material to emit the green light. The green organic light-emitting layer 133 located in the green secondary sub pixel c and the green organic light-emitting layer 133 located in the green secondary sub pixel d are formed in the same one process and are connected with each other. The fourth mask for forming the third organic light-emitting layer has an opening which defines that the first mask of the green sub pixel has two openings.

In some embodiments of the disclosure, the red organic light emitting layer 131 in the red sub pixel a and the blue organic light emitting layer 132 in the blue sub pixel b are formed prior to forming the green organic light emitting layers 133 in the green secondary sub pixels c and d, or alternatively the green organic light emitting layers 133 in the green secondary sub pixels c and d are formed prior to forming the red organic light emitting layer 131 in the red sub pixel a and the blue organic light emitting layer 132 in the blue sub pixel b, which is not limited herein.

In the organic light emitting diode display device shown in FIG. 9, each of the pixel units includes two red sub pixels (a1 and a2 in FIG. 9), two blue sub pixels (b1 and b2 in FIG. 9) and four third sub pixels (g1, g2, g3 and g4 in FIG. 9), each of the third sub pixels includes two third secondary sub pixels (two parts spaced apart by dotted line in FIG. 9). In some embodiments, the pixel unit has a hexagonal shape. In some embodiments, in consideration of factors such as process, appearance and display effect, the pixel unit has a hexagonal shape which is axisymmetric in some embodiments. The center of one red sub pixel a1 is located at one vertex of the hexagonal shape, the centers of two blue sub pixels b1 and b2 are respectively located at two vertexes of the hexagonal shape adjacent to the one vertex including the center of the red sub pixel a1, the centers of three green sub pixels g1, g2 and g3 are respectively located at the remaining three vertexes of the hexagonal shape, the center of another green sub pixel g4 is located at a midpoint of a diagonal connecting the two vertexes including the centers of the two blue sub pixels b1 and b2, and the center of another red sub pixel a2 is located at a midpoint of a diagonal connecting the two vertexes including the centers of the green sub pixels g1 and g3. The manufacturing method of the organic light-emitting diode display device shown in FIG. 9 is basically similarly to that of the organic light-emitting diode display device shown in FIG. 2, those skilled in the art can understand the manufacturing method of the organic light-emitting diode display device shown in FIG. 9 by referring to the manufacturing method of the organic light-emitting diode display device shown in FIG. 2, which is not repeatedly described.

Based on the manufacturing method of the organic light-emitting diode display device provided by embodiments of the disclosure, the gravity center of the displayed image in the organic light-emitting diode display device can be balanced and the color mixing phenomenon in the organic light-emitting diode display panel can be avoided, thereby increasing the yield of the organic light-emitting diode display device. In addition, the aperture ratio of the pixel units can be guaranteed thereby increasing, and thus the efficiency of the organic light-emitting diode display device is increased. Moreover, in terms of the manufacturing process, when the green organic light-emitting layer within at least two green secondary sub pixels are connected with other, the difficulty for manufacturing the mask is decreased and the color mixing phenomenon in the organic light-emitting diode display panel can be avoided during performing vapor deposition.

It is noted that embodiments and the applied technology principles of the disclosure are described as above. It should be understood for those skilled in the art that the disclosure is not limited to particular embodiments described herein. Various apparent changes, readjustment and alternative can be made by those skilled in the art without departing the scope of protection of the disclosure. Therefore, although the disclosure is illustrated in detail through the above embodiments, the disclosure is not limited to the above embodiments, and can further include other embodiments without departing the conception of the disclosure. The scope of the disclosure is subject to the appended claims.

Various modifications and additions can be made to the exemplary embodiments discussed without departing from the scope of the present disclosure. For example, while the embodiments described above refer to particular features, the scope of this disclosure also includes embodiments having different combinations of features and embodiments that do not include all of the described features. Accordingly, the scope of the present disclosure is intended to embrace all such alternatives, modifications, and variations as fall within the scope of the claims, together with all equivalents thereof.

We claim:

1. An organic light emitting diode display device, comprising:
   a substrate;
   a pixel definition layer located on the substrate, wherein a plurality of pixel units arranged together are defined in the pixel definition layer, at least one of the pixel units comprises two red sub pixels, two blue sub pixels, and four green sub pixels, and each of the four green sub pixels comprises two green secondary sub pixels;
   a first organic light emitting layer arranged in each of the two red sub pixels, wherein the first organic light emitting layer comprises a first organic light emitting material for emitting light in a first primary color;
   a second organic light emitting layer arranged in each of the two blue sub pixels, wherein the second organic light emitting layer comprises a second organic light emitting material for emitting light in a second primary color; and
   third organic light emitting layers arranged in the two green secondary sub pixels of each of the four green sub pixels, wherein the third organic light emitting layer comprises a third organic light emitting material for emitting light in a third primary color that has the strongest luminous characteristic;

wherein the third organic light emitting layers arranged in the two green secondary sub pixels of each of the four green sub pixels are connected with each other.

2. The organic light emitting diode display device of claim 1, wherein the two green secondary sub pixels are driven by two driving circuits, respectively.

3. The organic light emitting diode display device of claim 1, wherein
the at least one of the pixel units has a hexagonal shape, wherein one of the two red sub pixels is located at one vertex of the hexagonal shape; the two blue sub pixels are respectively located at two vertexes of the hexagonal shape adjacent to the one vertex comprising the red sub pixel; three of the four green sub pixels are respectively located at three remaining vertexes of the hexagon; the other one of the fourth green sub pixels is located at a midpoint of a diagonal connecting the two vertexes comprising the two blue sub pixels; and the other one of the two red sub pixels is located at a midpoint of a diagonal connecting the two vertexes comprising the two green sub pixels.

4. The organic light emitting diode display device of claim 3, wherein the hexagonal shape is axisymmetric.

5. The organic light emitting diode display device of claim 1, wherein each of the two red sub pixels, the two blue sub pixels and the four green sub pixels has a polygonal shape.

6. The organic light emitting diode display device of claim 5, wherein an internal angle of each of the two red sub pixels, the two blue sub pixels, and the four green sub pixels is larger than or equal to 90°.

7. The organic light emitting diode display device of claim 6, wherein the two red sub pixels have a rectangular shape, the two blue sub pixels have a pentagonal shape with three right angles and two obtuse angles, and the four green sub pixels have a hexagonal shape with four right angles and two obtuse angles.

8. The organic light emitting diode display device of claim 1, wherein an area of each of the two blue sub pixels is larger than that of each of the two red sub pixels.

* * * * *